US009165630B2

(12) United States Patent
Jung et al.

(10) Patent No.: US 9,165,630 B2
(45) Date of Patent: Oct. 20, 2015

(54) OFFSET CANCELING DUAL STAGE SENSING CIRCUIT

(71) Applicants: QUALCOMM Incorporated, San Diego, CA (US); Industry-Academic Cooperation Foundation, Seoul (KR)

(72) Inventors: Seong-Ook Jung, Seoul (KR); Taehui Na, Seoul (KR); Jisu Kim, Seoul (KR); Jung Pill Kim, San Diego, CA (US); Seung Hyuk Kang, San Diego, CA (US)

(73) Assignees: QUALCOMM INCORPORATED, San Diego, CA (US); INDUSTRY-ACADEMIC COOPERATION FOUNDATION, Seoul (KR)

( * ) Notice: Subject to any disclaimer, the term of this patent is extended or adjusted under 35 U.S.C. 154(b) by 148 days.

(21) Appl. No.: 14/015,845

(22) Filed: Aug. 30, 2013

(65) Prior Publication Data
US 2015/0063012 A1    Mar. 5, 2015

(51) Int. Cl.
G11C 11/00    (2006.01)
G11C 11/16    (2006.01)
G11C 7/06    (2006.01)
G11C 13/00    (2006.01)

(52) U.S. Cl.
CPC .............. *G11C 11/1673* (2013.01); *G11C 7/06* (2013.01); *G11C 7/065* (2013.01); *G11C 13/004* (2013.01); *G11C 11/1693* (2013.01); *G11C 2013/0054* (2013.01); *G11C 2013/0057* (2013.01)

(58) Field of Classification Search
USPC .................. 365/158, 205, 206, 207
See application file for complete search history.

(56) References Cited

U.S. PATENT DOCUMENTS

| 5,608,676 | A | * | 3/1997 | Medlock et al. | .......... 365/189.09 |
|---|---|---|---|---|---|
| 6,181,621 | B1 | | 1/2001 | Lovett | |
| 6,504,778 | B1 | * | 1/2003 | Uekubo | .................. 365/189.15 |
| 6,741,490 | B2 | * | 5/2004 | Baker | ........................... 365/148 |
| 7,046,565 | B1 | * | 5/2006 | Barth et al. | .................... 365/203 |
| 7,764,536 | B2 | | 7/2010 | Luo et al. | |
| 7,809,088 | B2 | | 10/2010 | Zerbe et al. | |
| 8,203,899 | B2 | | 6/2012 | Chen et al. | |

(Continued)

FOREIGN PATENT DOCUMENTS

| CN | 102543146 A | 7/2012 |
|---|---|---|
| WO | 8203513 A1 | 10/1982 |
| WO | 2013043738 A1 | 3/2013 |

OTHER PUBLICATIONS

International Search Report and Written Opinion—PCT/US2014/046048—ISA/EPO—Feb. 6, 2015.

(Continued)

*Primary Examiner* — Pho M Luu
(74) *Attorney, Agent, or Firm* — Seyfarth Shaw LLP

(57) ABSTRACT

An offset canceling dual stage sensing method includes sensing a data value of a resistive memory data cell using a first load PMOS gate voltage generated by a reference value of a resistive memory reference cell in a first stage operation. The method also includes sensing the reference value of the resistive memory reference cell using a second load PMOS gate voltage generated by the data value of the resistive memory data cell in a second stage operation of the resistive memory sensing circuit. By adjusting the operating point of the reference cell sensing, an offset canceling dual stage sensing circuit increases the sense margin significantly compared to that of a conventional sensing circuit.

20 Claims, 14 Drawing Sheets

(56) References Cited

U.S. PATENT DOCUMENTS

| | | |
|---|---|---|
| 8,254,195 B2 * | 8/2012 | Rao ............................ 365/209 |
| 8,378,716 B2 | 2/2013 | Wu et al. |
| 2006/0104136 A1 | 5/2006 | Gogl et al. |
| 2010/0321976 A1 | 12/2010 | Jung et al. |
| 2011/0051532 A1 | 3/2011 | Barth, Jr. et al. |
| 2011/0255359 A1 | 10/2011 | Sachdev et al. |
| 2014/0056058 A1 | 2/2014 | Jefremow et al. |
| 2014/0056059 A1 | 2/2014 | Mueller et al. |
| 2014/0153313 A1 | 6/2014 | Boujamaa et al. |

OTHER PUBLICATIONS

Partial International Search Report—PCT/US2014/046048—ISA/EPO—Oct. 14, 2014.

* cited by examiner

US 9,165,630 B2

OFFSET CANCELING DUAL STAGE SENSING CIRCUIT

TECHNICAL FIELD

The present disclosure generally relates to magnetic random access memory (MRAM). More specifically, the present disclosure relates to sensing circuitry for spin torque transfer magnetic random access memory (STT-MRAM) cells.

BACKGROUND

Unlike conventional random access memory (RAM) chip technologies, in magnetic RAM (MRAM) data is not stored as electric charge, but is instead stored by magnetic polarization of storage elements. The storage elements are formed from two ferromagnetic layers separated by a tunneling layer. One of the two ferromagnetic layers, which is referred to as the fixed layer or pinned layer, has a magnetization that is fixed in a particular direction. The other ferromagnetic magnetic layer, which is referred to as the free layer, has a magnetization direction that can be altered to represent either a "1" when the free layer magnetization is anti-parallel to the fixed layer magnetization or "0" when the free layer magnetization is parallel to the fixed layer magnetization or vice versa. One such device having a fixed layer, a tunneling layer, and a free layer is a magnetic tunnel junction (MTJ). The electrical resistance of an MTJ depends on whether the free layer magnetization and fixed layer magnetization are parallel or anti-parallel with each other. A memory device such as MRAM is built from an array of individually addressable MTJs.

To write data in a conventional MRAM, a write current, which exceeds a critical switching current, is applied through an MTJ. The write current exceeding the critical switching current is sufficient to change the magnetization direction of the free layer. When the write current flows in a first direction, the MTJ can be placed into or remain in a first state, in which its free layer magnetization direction and fixed layer magnetization direction are aligned in a parallel orientation. When the write current flows in a second direction, opposite to the first direction, the MTJ can be placed into or remain in a second state, in which its free layer magnetization and fixed layer magnetization are in an anti-parallel orientation.

To read data in a conventional MRAM, a read current flows through the MTJ via the same current path used to write data in the MTJ. If the magnetizations of the MTJ's free layer and fixed layer are oriented parallel to each other, the MTJ presents a resistance that is different than the resistance the MTJ would present if the magnetizations of the free layer and the fixed layer were in an anti-parallel orientation. In a conventional MRAM, two distinct states are defined by two different resistances of an MTJ in a bitcell of the MRAM. The two different resistances represent a logic "0" and a logic "1" value stored by the MTJ.

MRAM is an inherently scalable type of memory because the MTJ critical switching current ($I_c$) scales linearly with device area. However, as the critical switching current for writing to an MTJ decreases, the sensing current used to measure the resistance of the MTJ for reading its logical state (magnetization orientation) also decreases to prevent a read disturbance. For example, due to process variations the sensing current used to measure the resistance of an MTJ could exceed the critical switching current and change the logical state of the MTJ being read. Thus, increased scaling of MRAM leads to a reduced sensing margin. The reduction of sensing current may also causes reduced switching speed of the MTJ.

The critical switching current of an MTJ increases sharply when the pulse width of the switching current is decreased. One technique that may be used to avoid read disturbance is to apply a sensing current having a short pulse width to read the state of the MTJ. For example, a sensing current pulse width less than about 10 nano-seconds (ns) may be used to avoid read disturbance because the critical switching current is high for such a short pulse of current. Although the read pulse width may be reduced with technology scaling to avoid read disturbance, the read pulse width has a lower limit of about 3 ns for correct sensing operation. Therefore, decreasing the sensing current will still occur as MTJ technology scaling increases.

BRIEF SUMMARY

A sensing method according to an aspect of the present disclosure includes sensing a data value of a resistive memory data cell using a first load PMOS gate voltage generated by a reference value of a resistive memory reference cell in a first stage operation of a resistive memory sensing circuit. In a second stage operation of the resistive memory sensing circuit, the sensing method includes sensing the reference value of the resistive memory reference cell using a second load PMOS gate voltage generated by the data value of the resistive memory data cell.

A sensing apparatus according to another aspect of the present disclosure includes a sense amplifier circuit including a first switch coupled between a first output node and a first input node, and a second switch coupled between a second output node and a second input node. The first switch and the second switch are controlled by a sense amplifier enable signal.

A sensing method according to another aspect of the present disclosure includes a first stage operation of a resistive memory sensing circuit and a second state operation of the resistive memory sensing circuit. The first stage operation includes applying a first load transistor gate voltage to a first load transistor based on a reference value ($R_{ref}$) of a resistive memory reference cell, applying a first sense current through the first load transistor to a resistive memory data cell based on the first load transistor gate voltage, and sensing a data value of the resistive memory data cell based on the first sense current. The second stage operation includes applying a second load transistor gate voltage to a second load transistor based on a data value ($R_{data}$) of the resistive memory data cell, applying a second sense current through the second load transistor to the resistive memory reference cell, and sensing a reference value of the resistive memory reference cell based on the second sense current.

A resistive memory sensing apparatus according to another aspect of the present disclosure includes means for sensing a data value of a resistive memory data cell during a first stage operation of the resistive memory sensing apparatus using a first load PMOS gate voltage generated by a reference value of a resistive memory reference cell. The apparatus also has means for sensing the reference value of the resistive memory reference cell during a second stage operation of the resistive memory sensing apparatus using a second load PMOS gate voltage generated by the data value of the resistive memory data cell.

A resistive memory sensing circuit according to another aspect of the present disclosure includes means for applying a first load transistor gate voltage to a first load transistor during a first stage operation of the resistive memory sensing circuit based on a reference value ($R_{ref}$) of a resistive memory reference cell. The circuit also has means for applying a first sense current through the first load transistor to a resistive memory data cell during the first stage operation based on the first load transistor gate voltage. The circuit also has means for sensing a data value of the resistive memory data cell during the first stage operation based on the first sense current. The resistive memory sensing circuit also includes means for applying a second load transistor gate voltage to a second load transistor during a second stage operation of the resistive memory sensing circuit after the first stage operation based on a data value ($R_{data}$) of the resistive memory data cell. The circuit also has means for applying a second sense current through the second load transistor to the resistive memory reference cell during the second stage operation, and means for sensing a reference value of the resistive memory reference cell during the second stage operation based on the second sense current.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

DESCRIPTION OF THE DRAWINGS

For a more complete understanding of the present disclosure, reference is now made to the following description taken in conjunction with the accompanying drawings.

DETAILED DESCRIPTION

Figure 1:
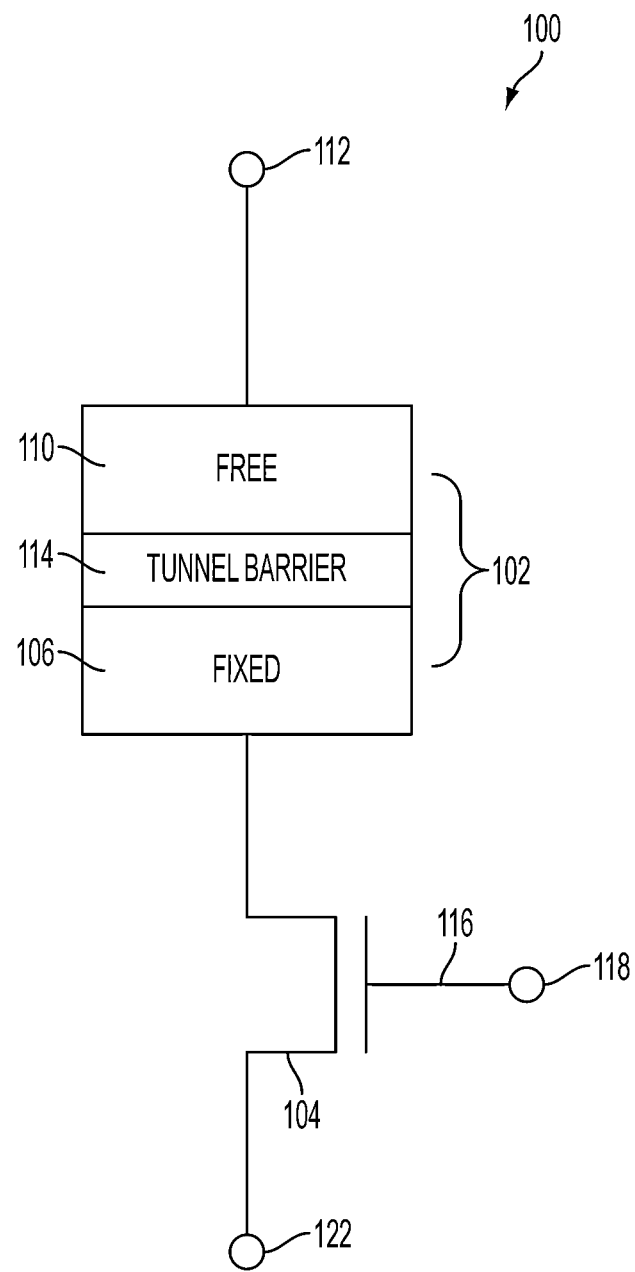
FIG. 1 is a diagram of a resistive memory element.

FIG. 1 illustrates a resistive memory element 100 including a magnetic tunnel junction (MTJ) 102 coupled to an access transistor 104. A free layer 110 of the MTJ 102 is coupled to a bit line 112. The access transistor 104 is coupled between a fixed layer 106 of the MTJ 102 and a fixed potential node 122. A tunnel barrier layer 114 is coupled between the fixed layer 106 and the free layer 110. The access transistor 104 includes a gate 116 coupled to a word line 118.

Synthetic anti-ferromagnetic materials may be used to form the fixed layer 106 and the free layer 110. For example, the fixed layer 106 may comprise multiple material layers including a CoFeB, and Ru layer and a CoFe layer. The free layer 110 may be an anti-ferromagnetic material such as CoFeB, and the tunnel barrier layer 114 may be MgO, for example.

Figure 2:
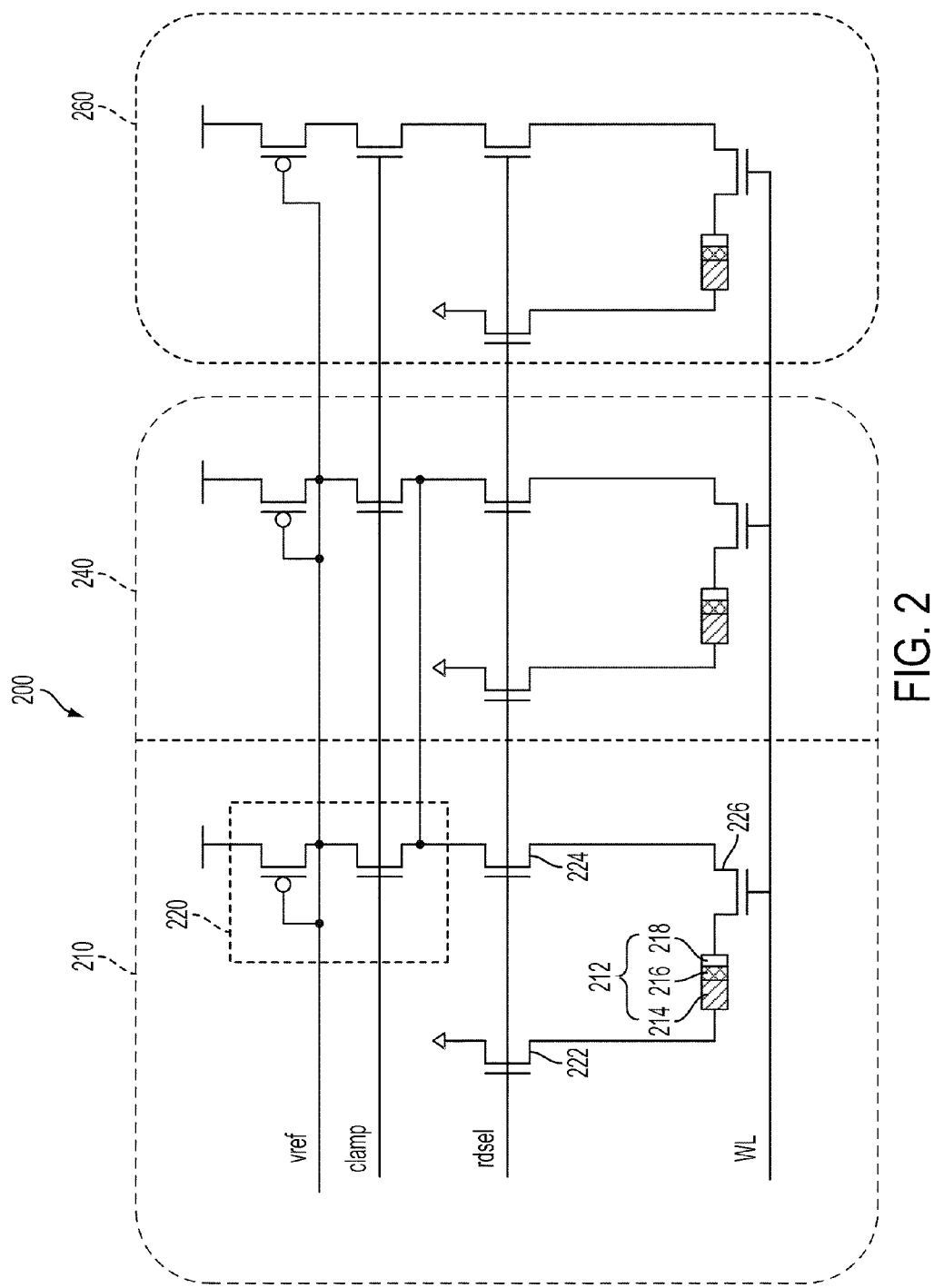
FIG. 2 is a diagram of a resistive memory device and circuitry for programming and reading the resistive device.

FIG. 2 is a circuit schematic illustrating a portion of a conventional magnetic random access memory (MRAM) 200. An MRAM 200 is divided into a data circuit 260, and reference circuits 240, 210, each circuit 210, 240, 260 including multiple bitcells 212 (only a single bitcell is illustrated to facilitate understanding). During read out of the bitcell of the data circuit 260, the resistance of the magnetic tunnel junction is compared to the effective resistance of two reference MTJs connected in parallel, where one is the reference parallel MTJ of the reference circuit 210 and the other is the reference anti-parallel MTJ of the reference circuit 240. Resistance of the bitcells is measured by applying a source voltage and determining an amount of current flowing through the bitcells. For example, in the bitcell of the parallel reference circuit 210, a current source 220 is applied to a magnetic tunnel junction (MTJ) 212 by read select transistors 222, 224, and a word line select transistor 226. Within each bit cell 212, an MTJ includes a fixed layer 214, tunneling layer 216, and a free layer 218. When the free layer 218 and the fixed layer 214 have magnetizations aligned substantially parallel, the resistance of the MTJ, and thus the bit cell 212, is low. When the free layer 218 and the fixed layer 214 have magnetizations aligned substantially anti-parallel, the resistance of the MTJ, and thus the bitcell 212, is high.

Bitcells of a magnetic random access memory (MRAM) may be arranged in one or more arrays including a pattern of memory elements (e.g., MTJ in case of MRAM). Spin-Transfer-Torque Magnetic Random Access Memory (STT-MRAM) is an emerging nonvolatile memory and its advantages of non-volatility, comparable speed to Dynamic Random Access Memory (DRAM), smaller chip size compared to Static Random Access Memory (SRAM), unlimited read/write endurance, and low array leakage current have opened a great opportunity to Spin-Transfer-Torque Magnetic Random Access Memory (STT-MRAM) as a universal working memory in System on Chip (SoC) design.

Figure 3A:
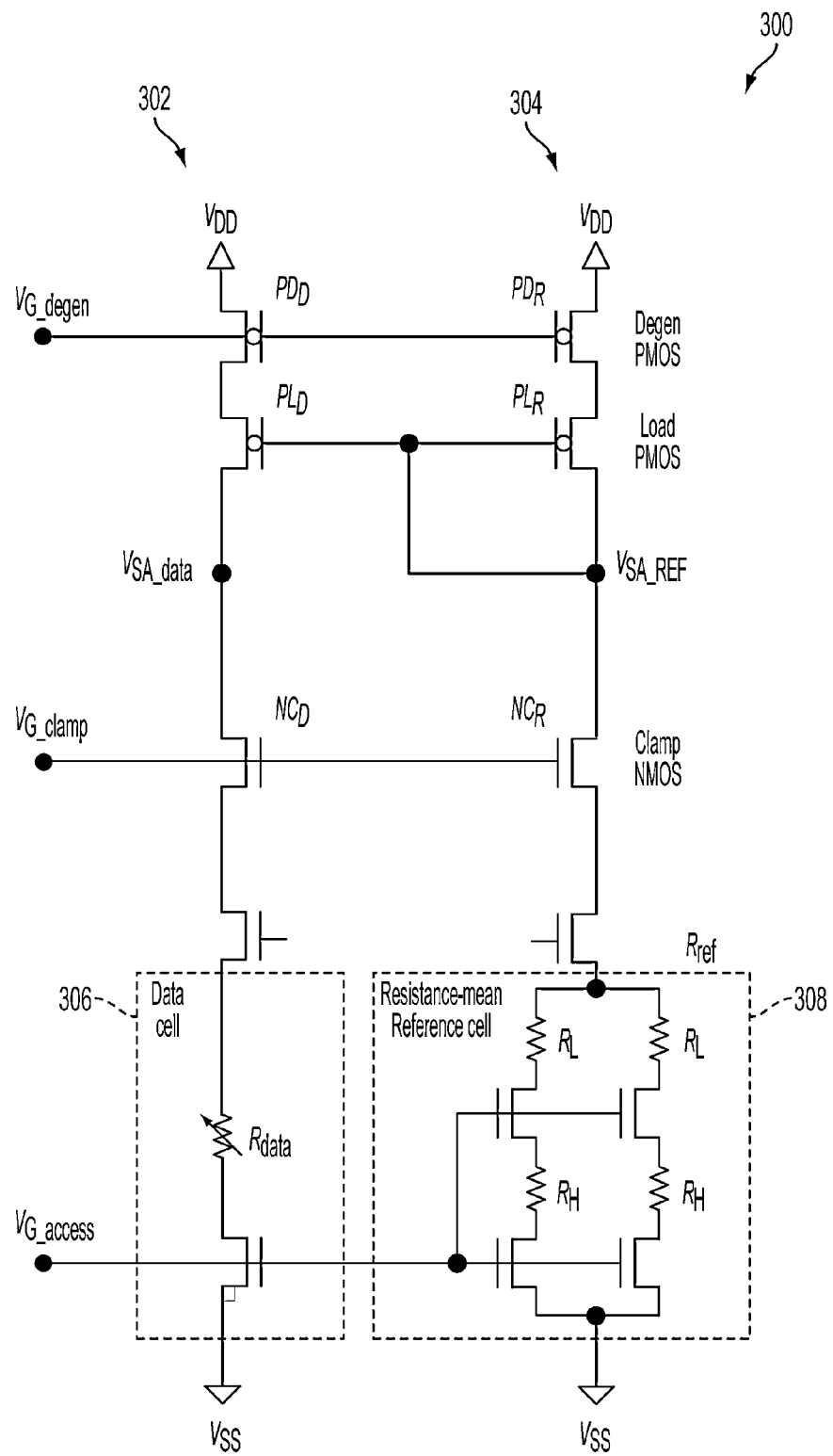
FIG. 3A is a diagram of a conventional resistive memory sensing circuit.

The effect of process variation on an MRAM sensing circuit is described with reference to FIGS. 3A-3B. FIG. 3A is a circuit schematic diagram illustrating a sensing circuit 300 in a portion of a conventional magnetic random access memory (MRAM). The sensing circuit 300 includes a data current path 302 and a reference current path 304. The data current path 302 includes a data path degeneration PMOS ($PD_D$), a data path load PMOS ($PL_D$) and a data path clamp NMOS ($NC_D$) coupled to a data cell 306. A data path sensing circuit output node ($V_{SA\_data}$) is located between the data path load PMOS ($PL_D$) and the data path clamp NMOS ($NC_D$). The reference current path 304 includes a reference path degeneration PMOS ($PD_R$), a reference path load PMOS ($PL_R$) and a reference path clamp NMOS ($NC_R$) coupled to a reference cell 308. A reference path sensing circuit output node ($V_{SA\_REF}$) is located between the reference path load PMOS ($PL_R$) and the reference path clamp NMOS ($NC_R$). The reference path sensing circuit output node ($V_{SA\_REF}$) is coupled to the gate of the data path load PMOS ($PL_D$) and the gate of the reference path load PMOS ($PL_R$).

Figure 3B:
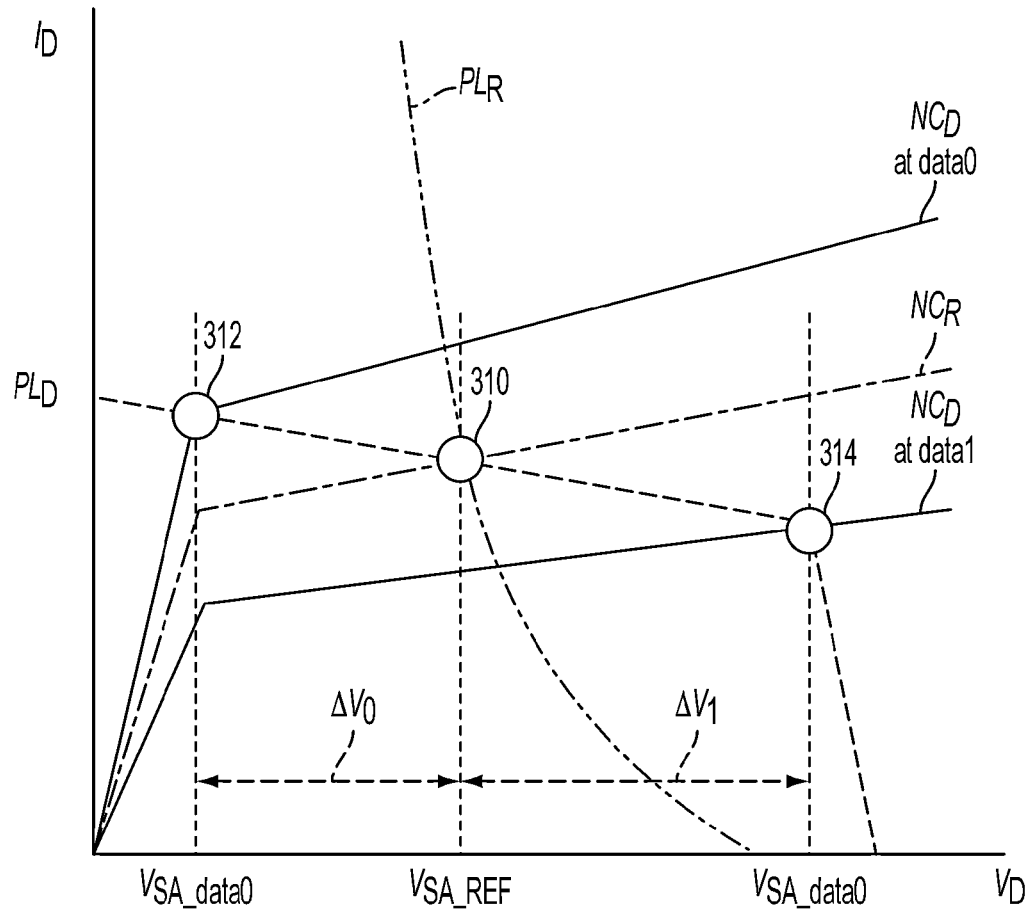
FIG. 3B is a graph showing voltage-current relationships of the conventional resistive memory sensing circuit shown in FIG. 3A.

FIG. 3B illustrates the current-voltage (I-V) curves of the data path clamp NMOS ($NC_D$), the reference path clamp NMOS ($NC_R$), and the reference path load PMOS in the data path load PMOS. The I-V curve of the data path clamp NMOS ($NC_D$) is shown for a data zero state of the data cell 306 and for data one state of the data cell 306. The crossing point between I-V curves of a clamp NMOS and a corresponding load PMOS represents an operating point of the respective current path.

In the conventional sensing circuit 300, the voltage at the reference path sensing circuit output node $V_{SA\_REF}$ is fixed at a reference path operating point 310. The voltage at the data path sensing circuit output node $V_{SA\_data}$ depends on the logical state of the data cell 306. When the data cell 306 is in a data zero state, the voltage at the data path sensing circuit output node $V_{SA\_data}$ is at a first data path operating point 312. When the data cell 306 is in a data one state, the voltage at the data path sensing circuit output node $V_{SA\_data}$ is at a second data path operating point 314. A large difference $\Delta V$ between the voltage at the reference path sensing circuit output node $V_{SA\_REF}$ and the voltage at the data path sensing circuit output node $V_{SA\_data}$ provides a more reliable sensing of the data in an MRAM.

Some variation of $\Delta V$ results from the process variations in fabricating the load PMOS and clamp NMOS of the sensing circuitry 300. Sensing failures resulting in incorrect data readings may be caused by process variation that results in decreasing $\Delta V$. Sensing margins are expected to be further degraded due to increases in process variations as the feature sizes of MRAM devices are reduced below about 90 nm, for example.

Aspects of the present disclosure include an offset canceling dual stage sensing circuit and voltage sense amplifier that improves tolerance of fabrication process variations and reduces the read disturbance of an MTJ. An offset canceling dual stage sensing circuit according to an aspect of the present disclosure is described with reference to the circuit diagrams in FIG. 4A-4C.

Figure 4A:
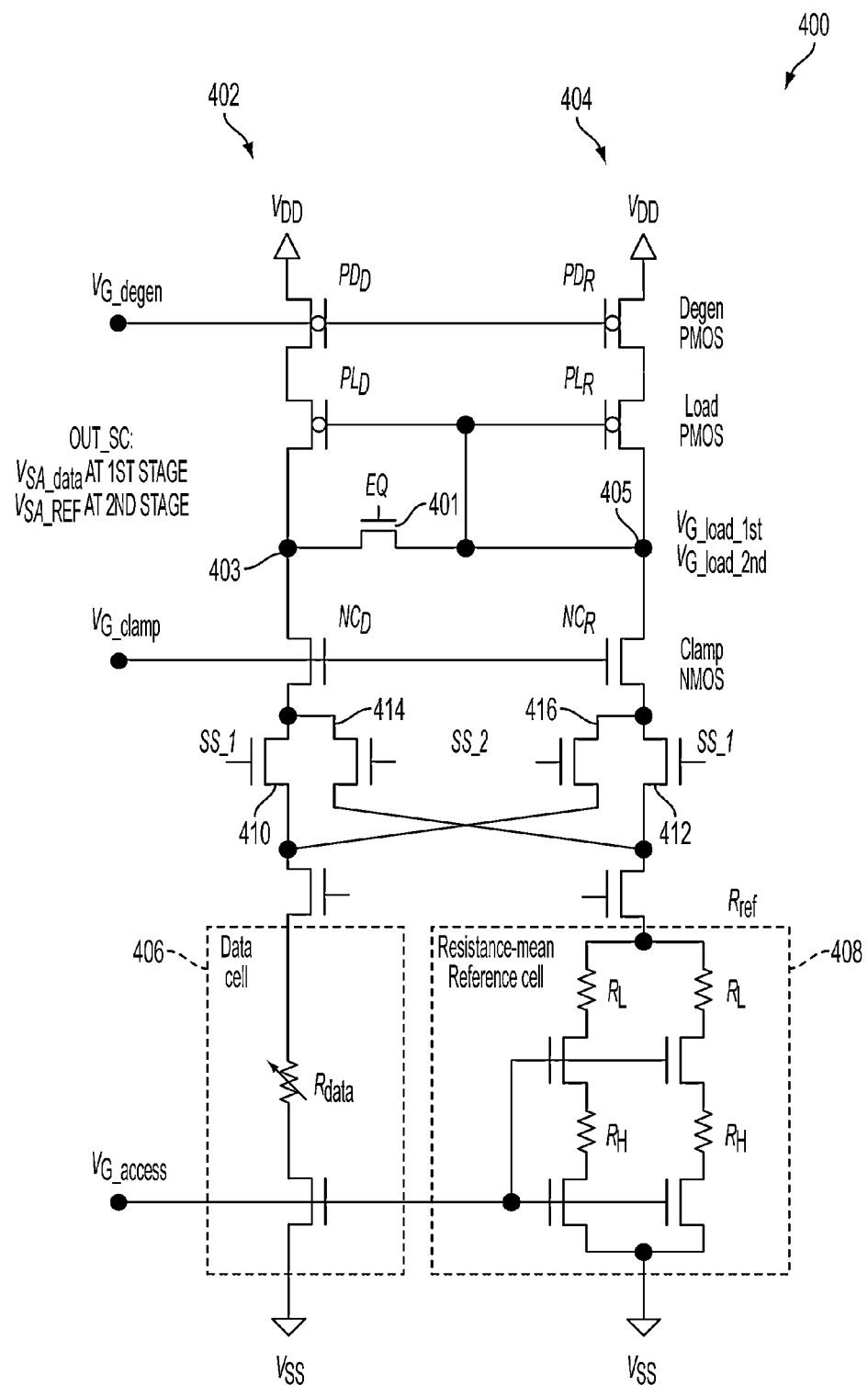
FIG. 4A is a diagram of an offset canceling dual stage sensing circuit according to an aspect of the present disclosure.

FIG. 4A is a circuit schematic illustrating an offset canceling dual stage sensing circuit 400 in a portion of a magnetic random access memory (MRAM). The offset canceling dual stage sensing circuit 400 includes a data current path 402 and a reference current path 404. The data current path 402 includes a data path degeneration PMOS ($PD_D$), a data path load PMOS ($PL_D$), a data path first stage switching transistor 410 and a data path clamp NMOS ($NC_D$) coupled to a data cell 406. A sensing circuit output node 403 is located between the data path load PMOS ($PL_D$) and the data path clamp NMOS ($NC_D$). The reference current path 404 includes a reference path degeneration PMOS ($PD_R$), a reference path load PMOS ($PL_R$), a reference path first stage switching transistor 412 and a reference path clamp NMOS ($NC_R$) coupled to a reference cell 408.

An adjustable load PMOS gate node 405 is located between the reference path load PMOS ($PL_R$) and the reference path clamp NMOS ($NC_R$). The adjustable load PMOS gate node 405 is coupled to the gate of the data path load PMOS ($PL_D$) and the gate of the reference path load PMOS ($PL_R$). An equalization transistor 401 is coupled between the sensing circuit output node 403 and the adjustable load PMOS gate node 405. A data path second stage switching transistor 414 is coupled between the data path clamp NMOS ($NC_D$) and the reference cell 408. A reference path second stage switching transistor 416 is coupled between the reference path clamp NMOS ($NC_R$) and the data cell 406.

In a first operating stage of the offset canceling dual stage sensing circuit 400, a first stage enable signal (SS_1) is on and a second stage enable signal (SS_2) is off. The first stage enable signal (SS_1) turns on the data path first stage switching transistor 410 and the reference path first stage switching transistor 412. Early in the first operating stage, an equalization signal (EQ) to the equalization transistor 401 becomes high. The data current path 402 is charged rapidly by equalizing an output ($V_{OUT\_SC}$) at the sensing circuit output node 403 and a load PMOS gate voltage ($V_{G\_load}$) at the adjustable load PMOS gate node 405. This equalization leads to an improvement in sensing speed. Later in the first operating stage, the equalization signal (EQ) becomes low, which decouples the sensing circuit output node 403 and the adjustable load PMOS gate node 405. Thus, during the first operating stage, $V_{G\_load\_1st}$ is generated based on $R_{ref}$ and $V_{SA\_data}$ is generated by using $R_{data}$ and $V_{G\_load\_1st}$.

In a second operating stage, of the offset canceling dual stage sensing circuit 400, the first stage enable signal (SS_1) is off and the second stage enable signal (SS_2) is on. The second stage enable signal (SS_2) turns on the data path second stage switching transistor 414 and the reference path second stage switching transistor 416. Early in the second operating stage, an equalization signal (EQ) becomes high so $V_{OUT\_SC}$ resets to $V_{G\_load}$. This equalization leads to an improvement in sensing speed. Later in the second operating stage, the equalization signal, (EQ) becomes low which decouples the sensing circuit output node 403 from the adjustable load PMOS gate node 405. Thus, during the second operating stage, $V_{G\_load\_2nd}$ is generated based on $R_{data}$, and $V_{SA\_REF}$ is generated based on $R_{ref}$ and $V_{G\_load\_2nd}$.

According to an aspect of the present disclosure, the offset canceling dual stage sensing circuit 400 generates both $V_{data}$ and $V_{ref}$ at the same node, i.e. the sensing circuit output node 403. This provides offset cancellation, which improves tolerance of process variations. According to another aspect of the present disclosure the adjustable load PMOS gate voltages $V_{G\_load\_1st}$ and $V_{G\_load\_2nd}$ provide a doubled sensing margin.

Figure 4B:
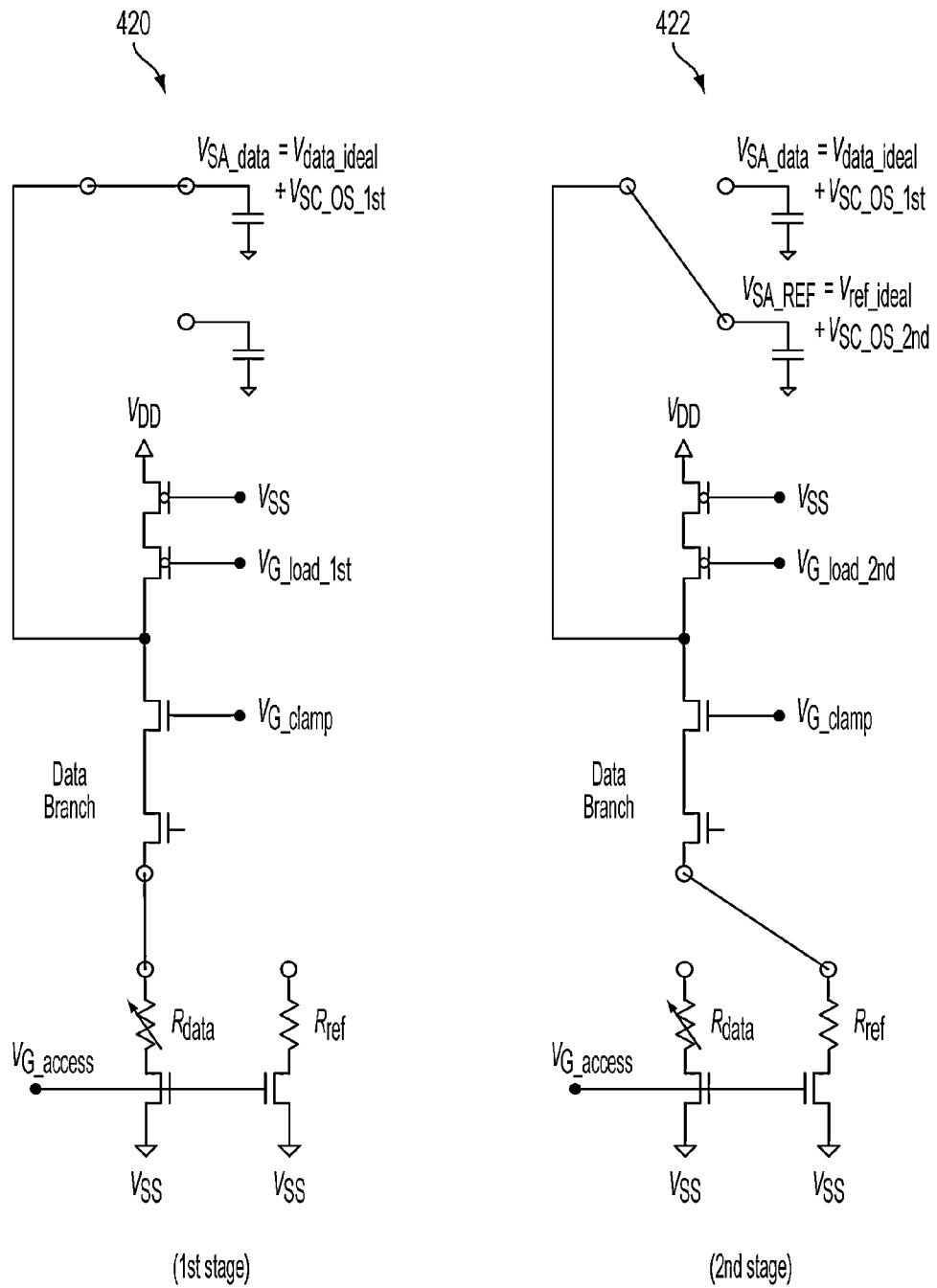
FIG. 4B is a diagram of each operating stage in an offset canceling dual stage sensing circuit according to aspects of the present disclosure.

The function of the offset canceling dual stage sensing circuit 400 according to aspects of the present disclosure is described further with reference to FIG. 4B During the first operating stage 420, $R_{data}$ is sensed ($V_{SA\_data}$) using $V_{G\_load\_1st}$ generated by $R_{ref}$. During the second operating stage 422, $R_{ref}$ is sensed ($V_{SA\_REF}$) using $V_{G\_load\_2nd}$ generated by $R_{data}$. By comparing $V_{SA\_data}$ with $V_{SA\_REF}$, the effect of process variation can be canceled out.

The ideal reference voltage $V_{ref}$ of an MRAM sensing circuit is defined as $$V_{ref\_ideal} = (V_{data0\_ideal} + V_{data1\_ideal})/2$$

With regard to offset cancellation, it can be assumed that $V_{G\_load\_1st}$ and $V_{G\_load\_2nd}$ are identical. Because $V_{SA\_data}$ and $V_{SA\_REF}$ are affected by the same load PMOS and the same clamp NMOS, they are subject to identical variation in the load PMOS and clamp NMOS. Thus, the sensing circuit offset voltage $V_{SC\_OS}$ during the first operating stage 420 becomes almost the same as the sensing circuit offset voltage $V_{SC\_OS}$ during the second operating stage 422. If it is assumed that $V_{SC\_OC}$ at each stage is identical, i.e., $V_{SC\_OS\_1st} = V_{SC\_OS\_2nd} = V_{SC\_OS}$, then, $$V_{SA\_data} = V_{data\_ideal} + V_{SC\_OS},$$

$$V_{SA\_REF} = V_{ref\_ideal} + V_{SC\_OS}$$

$$\Delta V = |V_{SA\_data} - V_{SA\_REF}|$$
$$= |V_{data\_ideal} - V_{ref\_ideal}|$$
$$= |V_{data\_ideal} - (V_{data0\_ideal} + V_{data1\_ideal})/2|$$
$$= |(V_{data1\_ideal} - V_{data0\_ideal})/2|$$
$$= \Delta V_{ideal}$$

Figure 4C:
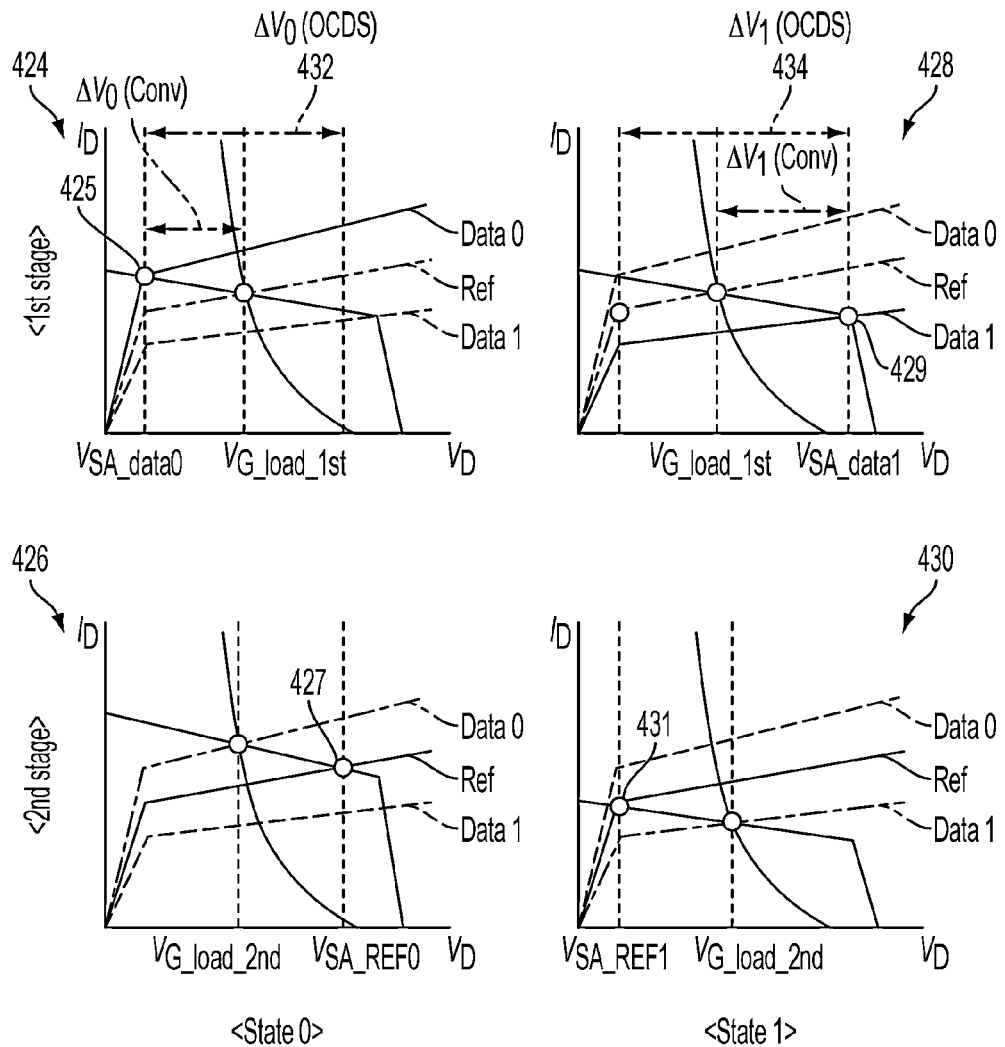
FIG. 4C is a graph showing voltage-current relationships of the offset canceling dual stage sensing circuit show in FIG. 4A.

FIG. 4C illustrates the current-voltage (I-V) curves of the data path clamp NMOS ($NC_D$), the reference path clamp NMOS ($NC_R$), the reference path load PMOS and the data path load PMOS for the first operating stage and the second operating stage of the offset cancelling dual stage sensing circuit 400 shown in FIG. 4A. The crossing point between I-V curves of a clamp NMOS and a corresponding load PMOS represents an operating point of the respective operating stage. The first stage I-V curve 424 for data state 0 shows a $V_{SA\_data0}$ operating point 425 that is about the same as $C_{SA\_data0}$ in a conventional sensing circuit, as shown in FIG. 3B, for example. However, the second stage I-V curve 426 for data state 0 shows a $V_{SA\_REF0}$ operating point 427 at a significantly higher voltage than the conventional sensing circuit. According to an aspect of the present disclosure, $V_{G\_load}$ during the second operating stage ($V_{G\_load\_2nd}$) is adjusted according to the data and $V_{SA\_REF}$ is determined by I-V curves of the clamp NMOS with the reference cell and the load PMOS with the $V_{G\_load\_2nd}$. Thus, $\Delta V_0$ 432 of the offset canceling dual stage sensing circuit 400 is increased by around two-fold compared to that of a conventional sensing circuit.

The first stage I-V curve 428 for data state 1 shows a $V_{SA\_data1}$ operating point 429 that is about the same as $V_{SA\_data1}$ in a conventional sensing circuit, as shown in FIG. 3B, for example. However, the second stage I-V curve 430 for data state 1 shows a $V_{SA\_REF1}$ operating point 431 at a significantly lower voltage than the conventional sensing circuit. Thus, $\Delta V_1$ 434 of the offset canceling dual stage sensing circuit 400 is increased by around two-fold compared to that of a conventional sensing circuit.

Figure 5A:
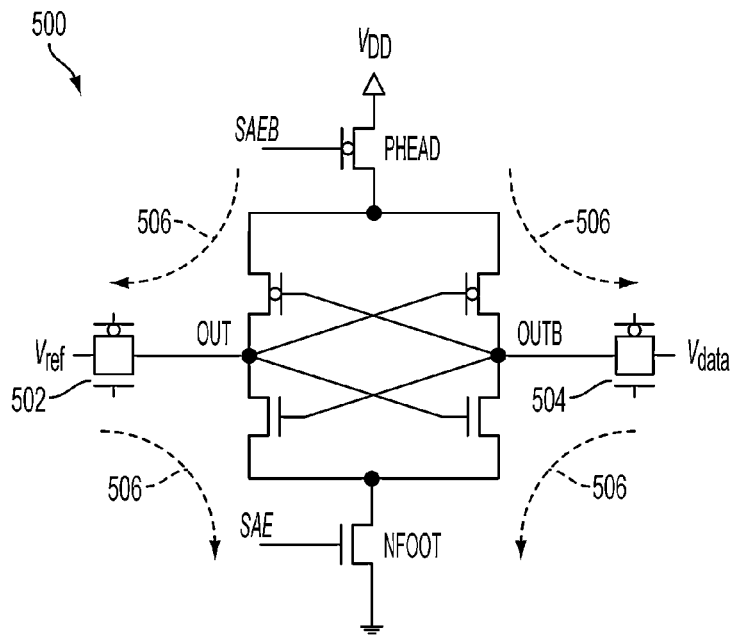
FIG. 5A is diagram of a conventional voltage level sense amplifier including a head switch transistor and a foot switch transistor.

FIG. 5A is a circuit schematic diagram illustrating a conventional voltage level sense amplifier (VLSA) circuit 500 that may be coupled to a conventional sensing circuit, such as the sensing circuit 300 shown in FIG. 3A, for example. The conventional VLSA circuit 500, includes transmission gate access transistors 502, 504, to transfer a voltage level of Vref and Vdata to output nodes OUT and OUTB respectively without threshold voltage ($V_{TH}$) loss. For NMOS access transistors, threshold voltage ($V_{THN}$) loss occurs when the input voltage is higher than $V_{DD} - V_{THN}$. Similarly, for PMOS access transistors, $V_{THP}$ loss occurs when the input voltage is lower than $|V_{THP}|$. Thus, the transmission gate access transistors 502, 504 are used to avoid threshold losses for a voltage range from GND to $V_{DD}$.

A head switch PMOS transistor (PHEAD) and a foot switch NMOS transistor (NFOOT) are used in the conventional VLSA circuit 500 to prevent the occurrence of invalid current paths 506 that would affect values of Vref and Vdata before a sense amplifier enable signal (SAE) is activated. However, a conventional VLSA circuit 500 cannot be effectively coupled to an offset canceling dual stage sensing circuit 400 shown in FIG. 4A because capacitive coupling may occur between Vref and Vdata.

Figure 5B:
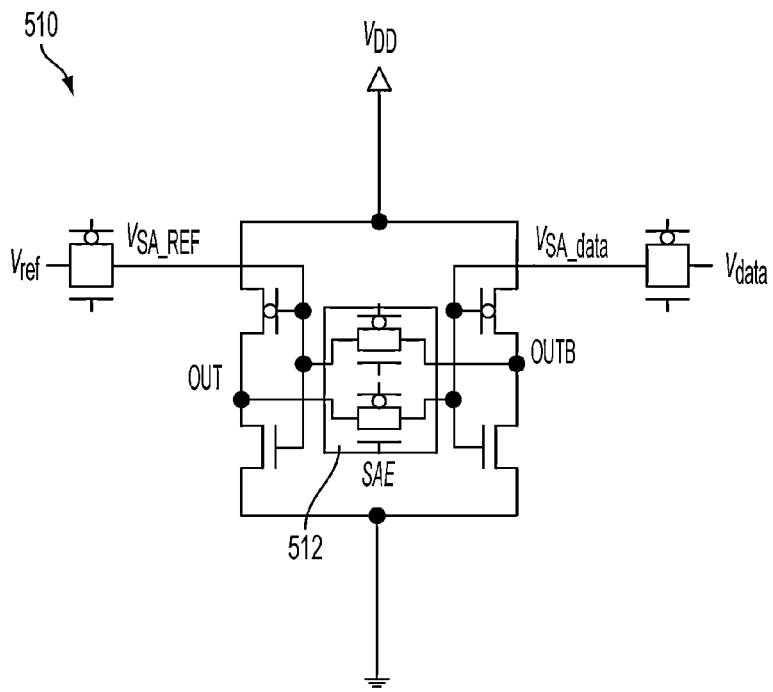
FIG. 5B is diagram of a conventional voltage level sense amplifier excluding a head switch transistor and a foot switch transistor.

Referring to FIG. 5B the capacitive coupling between Vref and Vdata may be prevented by adding two transmission gate switches 512 to a conventional VLSA circuit 510. The transmission gate switches are controlled by a sense amplifier enable signal SAE to isolate the two output nodes (OUT, OUTB) from each other, which prevents capacitive coupling between Vref and Vdata. In the VLSA circuit 510, because of the separation between the input and output nodes, invalid current paths such as current paths 506 in FIG. 5A do not occur. Therefore, a head switch transistor and a foot switch transistor are not included in the VLSA circuit 510.

Because the VLSA circuit 510 does not include a head switch transistor and a foot switch transistor, it suffers a detrimental static power dissipation. Furthermore, it is desirable to equalize the voltage of the output nodes OUT and OUTB nodes before the SAE signal is activated. To resolve these issues, a new sensing circuit is proposed.

Figure 6:
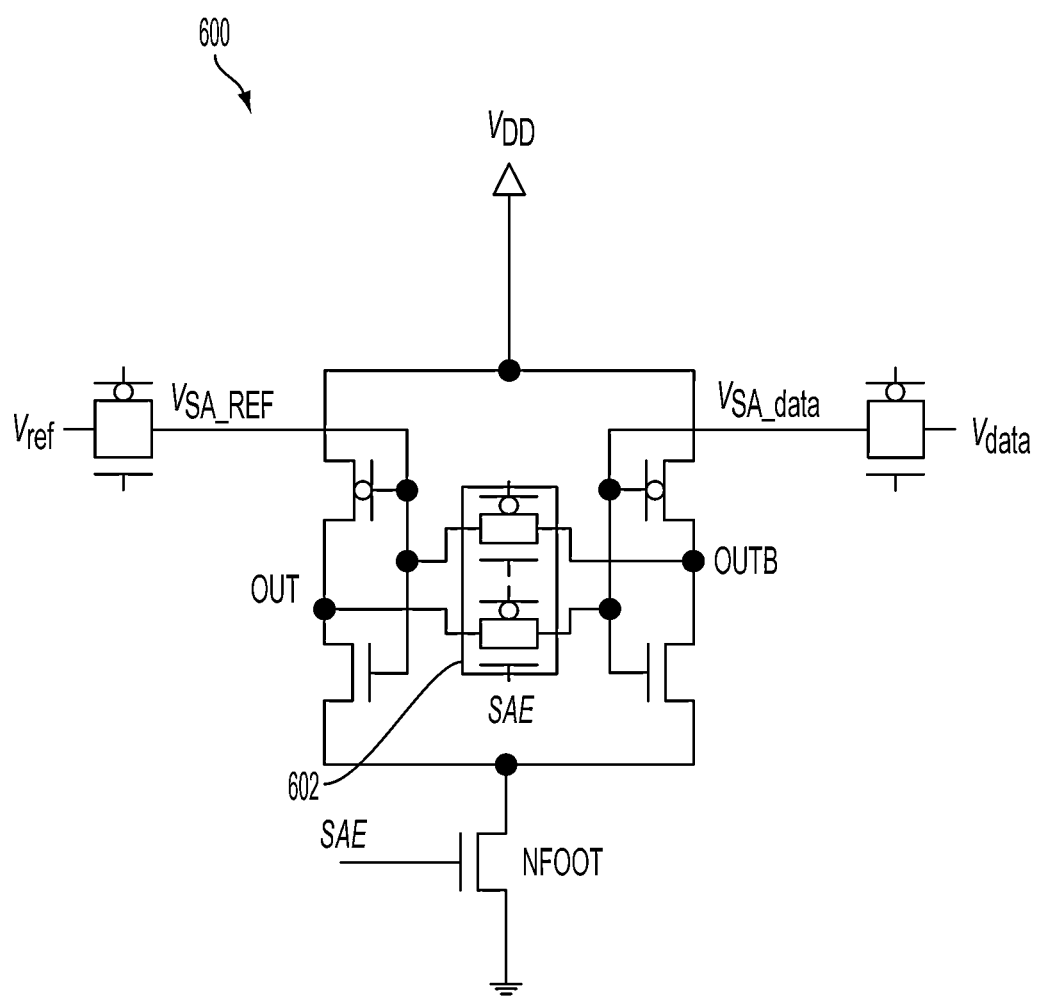
FIG. 6 is diagram of a voltage level sense amplifier according to an aspect of the present disclosure.

FIG. 6 is a circuit schematic diagram illustrating a voltage level sense amplifier (VLSA) circuit 600 that may be coupled to an offset cancelling dual stage sensing circuit 400 (FIG. 4A) according to an aspect of the present disclosure. The VLSA circuit 600 equalizes the voltage of output nodes (OUT and OUTB) before a sense amplifier enable SAE signal SAE is activated. Transmission gate switches 602 controlled by a sense amplifier enable signal SAE isolate the two output nodes (OUT, OUTB) from each other, which prevents capacitive coupling between Vref and Vdata. According to an aspect of the present disclosure, $V_{SA\_REF}$ and $V_{SA\_data}$ are precharged to ground (GND) in an idle state to prepare for the next sensing. The precharging of output nodes (OUT and OUTB) to VDD could lead to a static current path. According to an aspect of the present disclosure, the VLSA circuit includes a foot switch transistor NFOOT to prevent the static current path caused by precharging of the output nodes. Before the sense amplifier enable signal SAE is activated, $V_{SA\_REF}$ and $V_{SA\_data}$ are stored in the gate capacitors and diffusion capacitors of the NMOS and PMOS transistors. After the sense amplifier enable signal SAE is activated, the voltages of the output nodes (OUT and OUTB) become rail-to-rail voltages.

Figure 7:
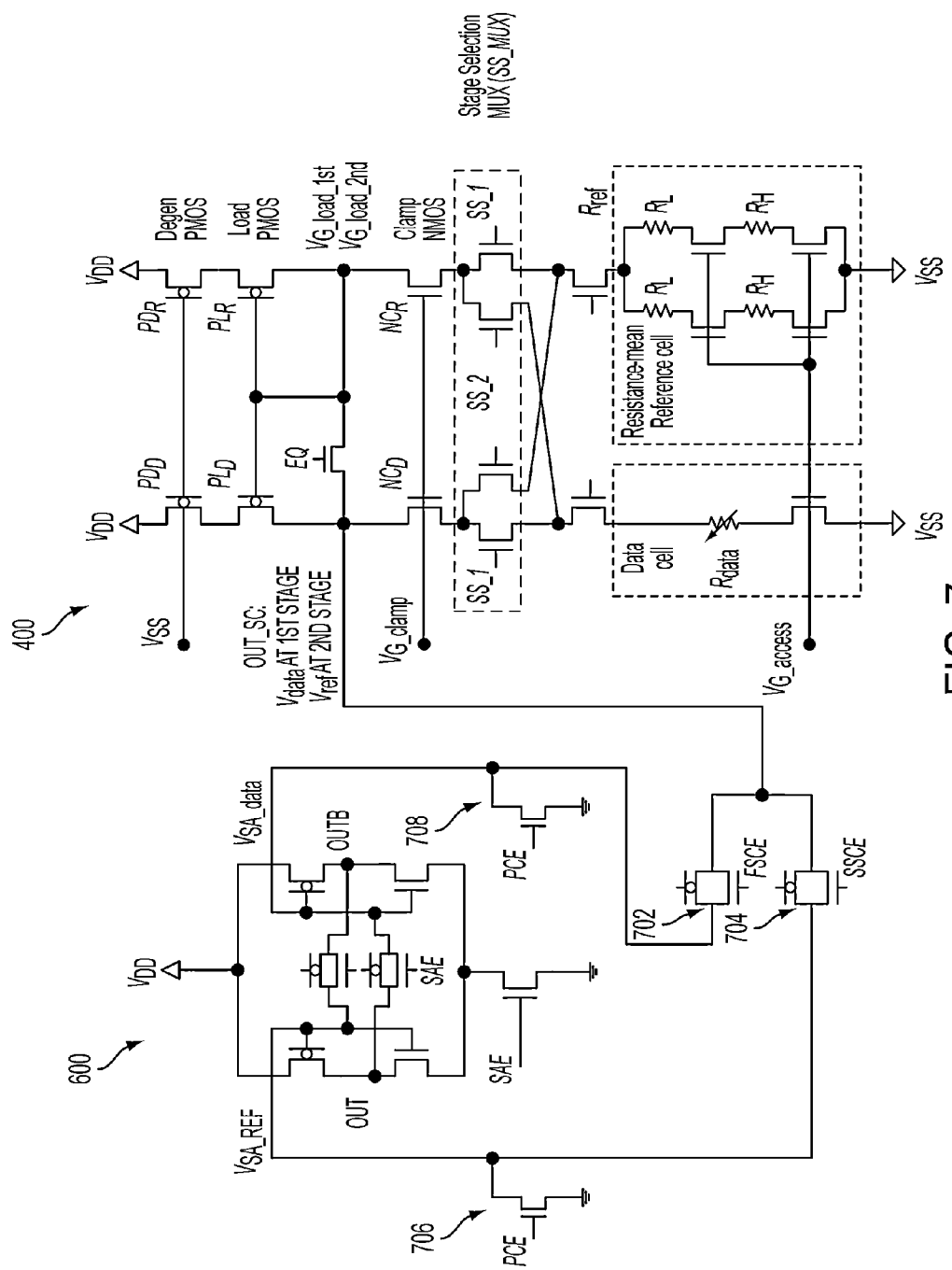
FIG. 7 is a diagram of an offset canceling dual stage sensing circuit coupled to a voltage level sense amplifier according to an aspect of the present disclosure.
Figure 8:
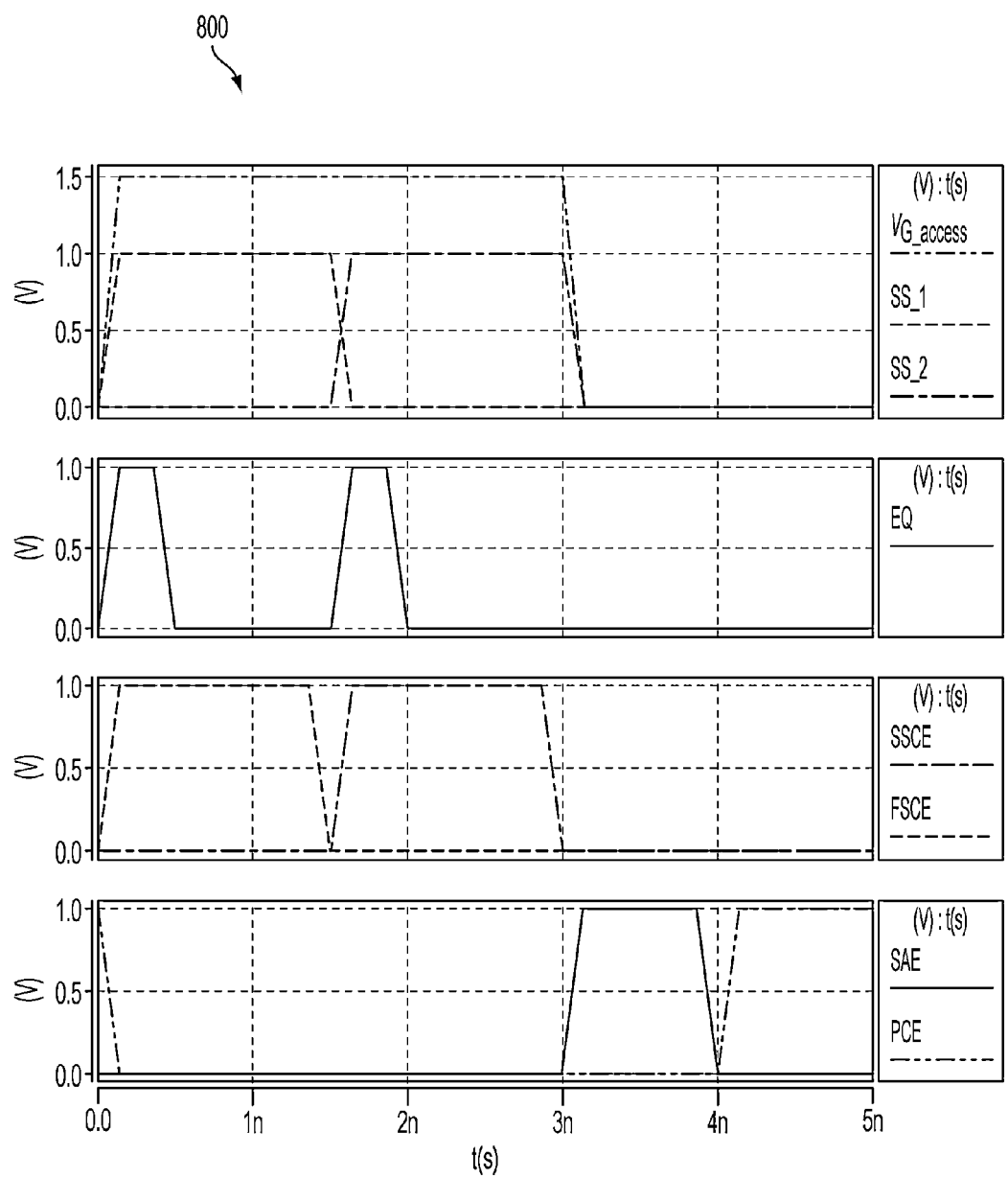
FIG. 8 is a timing diagram showing timing of the offset canceling dual stage sensing circuit and a voltage level sense amplifier shown in FIG. 7 according to an aspect of the present disclosure.

Cooperation of the VLSA circuit 600 and the offset canceling dual stage sensing circuit 400, according to an aspect of the present disclosure, is described with reference to FIG. 7 and FIG. 8. FIG. 8 shows a timing diagram 800 of the signals applied to the circuit shown in FIG. 7. The $V_{G\_access}$ signal is a word line access signal. The SS_1 signal is a stage selection signal for the first operating stage and the SS_2 signal is the stage selection signal at the second operating stage. The EQ signal is an equalization signal. The FSCE signal is a first switched capacitor enable signal that controls a pass gate 702. The SSCE signal is a second switched capacitor enable signal that controls another pass gate 704. The SAE signal is the sense amplifier enable signal, and the PCE signal is a precharge enable signal. The PCE signal controls a pair of enable transistors 706, 708. FIG. 8 shows that the pulse widths of the FSCE and SSCE signals are reduced by about 140 ps compared to the SS_1 and SS_2 signals, to avoid the overlap.

Figure 9:
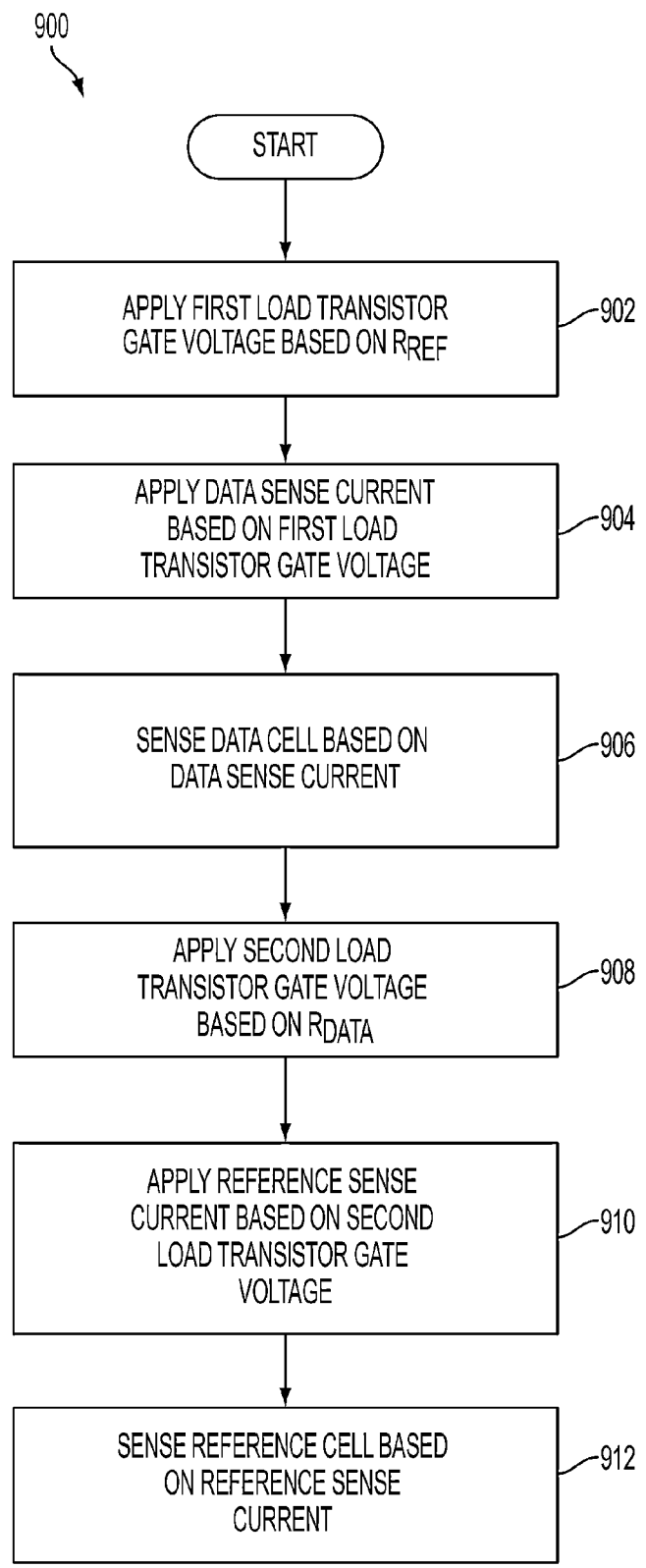
FIG. 9 is process flow diagram illustrating a resistive memory sensing method according to an aspect of the present disclosure.

FIG. 9 is a process flow diagram illustrating a resistive memory sensing method according to an aspect of the present disclosure. The method 900 includes applying a first load transistor gate voltage to a first load transistor based on a reference value (Rref) of a resistive memory reference cell in a first stage operation of a resistive memory sensing circuit at block 902. The first load transistor may be a first load PMOS, for example. At block 904, the method includes applying a first sense current through the first load transistor to a resistive memory data cell based on the first load transistor gate voltage in the first stage operation. At block 906, the method includes sensing a data value of the resistive memory data cell based on the first sense current in the first stage operation. The data value of the resistive memory data cell may be sensed using the first load PMOS gate voltage generated by the reference value of the resistive memory cell, for example.

At block 908, the method includes applying a second load transistor gate voltage to a second load transistor based on a data value (Rdata) of the resistive memory data cell. This voltage is applied in a second stage operation of the resistive memory sensing circuit that occurs after the first stage operation. The second load transistor may be a second load PMOS, for example. At block 910, the method includes applying a second sense current through the second load transistor to the resistive memory reference cell in the second stage operation. At block 912, the method includes sensing a reference value of the resistive memory reference cell based on the second sense current in the second stage operation. The reference value of the resistive memory reference cell sensed using the second PMOS gate voltage generated by the data value of the resistive memory data cell, for example.

A resistive memory sensing circuit according to another aspect of the present disclosure includes means for applying a first load transistor gate voltage to a first load transistor during a first stage operation of the resistive memory sensing circuit based on a reference value (Rref) of a resistive memory reference cell. The resistive memory sensing circuit also includes means for applying a first sense current through the first load transistor to a resistive memory data cell during the first stage operation based on the first load transistor gate voltage and means for sensing a data value of the resistive memory data cell during the first stage operation based on the first sense current. According to aspects of the present disclosure, the resistive memory sensing circuit also includes means for applying a second load transistor gate voltage to a second load transistor during a second stage operation of the resistive memory sensing circuit after the first stage operation based on a data value (Rdata) of the resistive memory data cell. The resistive memory sensing circuit also includes means for applying a second sense current through the second load transistor to the resistive memory reference cell during the second stage operation and means for sensing a reference value of the resistive memory reference cell during the second stage operation based on the second sense current.

The means for applying a first load transistor gate voltage, means for applying a first sense current, and means for sensing a data value of the resistive memory data cell may include the equalization transistor 401 and the first stage switching transistors 410, 412 as shown in FIG. 4A, for example. The means for applying a second load transistor gate voltage, means for applying a second sense current, and means for sensing a reference value of the resistive memory reference cell may include the equalization transistor 401 and the second stage switching transistors 414, 416 as shown in FIG. 4A, for example.

In another configuration, the aforementioned means may be any module or any apparatus configured to perform the functions recited by the aforementioned means. Although specific means have been set forth, it will be appreciated by those skilled in the art that not all of the disclosed means are required to practice the disclosed configurations. Moreover, certain well known means have not been described, to maintain focus on the disclosure.

Figure 10:
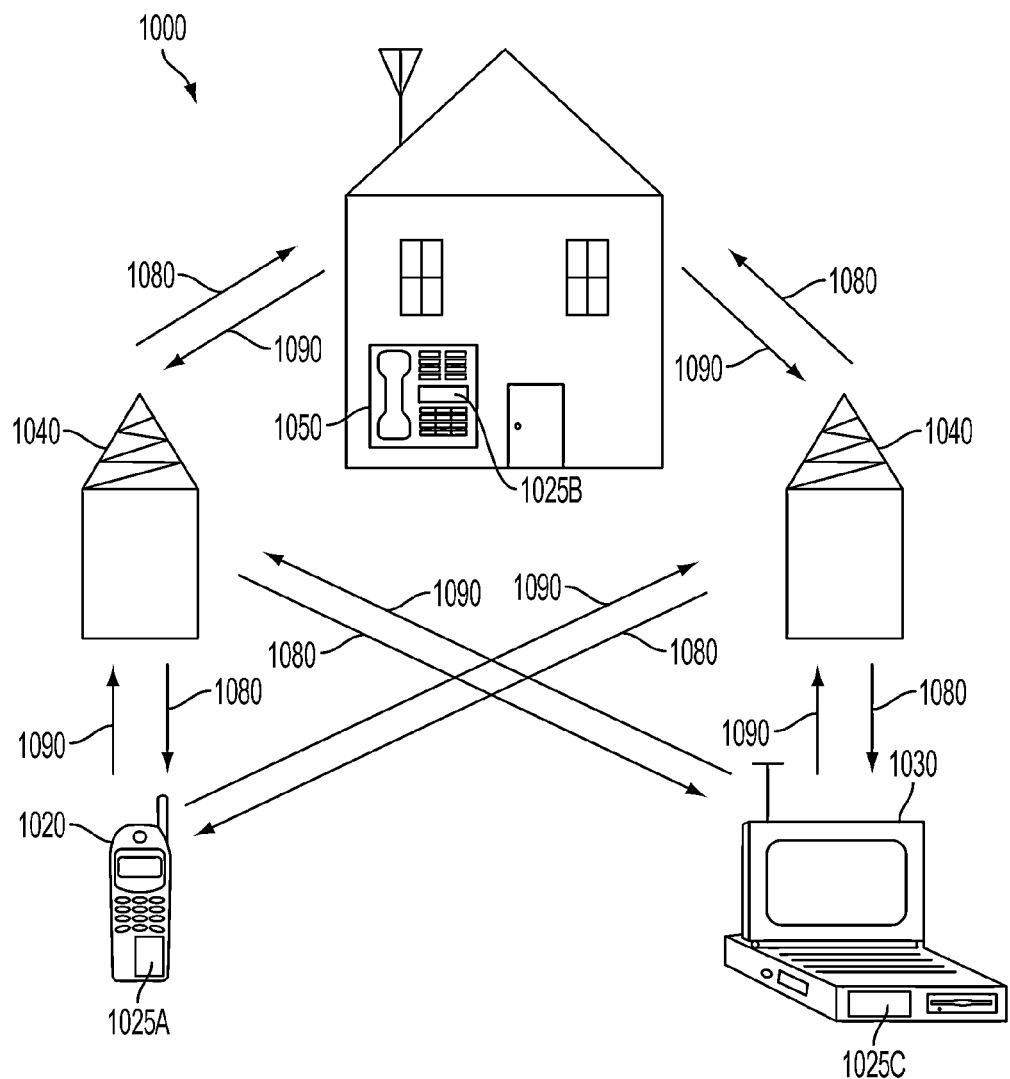
FIG. 10 is a block diagram showing an exemplary wireless communication system in which a configuration of the disclosure may be advantageously employed.

FIG. 10 is a block diagram showing an exemplary wireless communication system 1000 in which an aspect of the disclosure may be advantageously employed. For purposes of illustration, FIG. 10 shows three remote units 1020, 1030, and 1050 and two base stations 1040. It will be recognized that wireless communication systems may have many more remote units and base stations. Remote units 1020, 1030, and 1050 include IC devices 1025A, 1025C and 1025B that include the disclosed offset canceling dual stage sensing apparatus. It will be recognized that other devices may also include the disclosed offset canceling dual stage sensing apparatus, such as the base stations, switching devices, and network equipment. FIG. 10 shows forward link signals 1080 from the base station 1040 to the remote units 1020, 1030, and 1050 and reverse link signals 1090 from the remote units 1020, 1030, and 1050 to base stations 1040.

In FIG. 10, remote unit 1020 is shown as a mobile telephone, remote unit 1030 is shown as a portable computer, and remote unit 1050 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or other devices that store or retrieve data or computer instructions, or combinations thereof. Although FIG. 10 illustrates remote units according to the teachings of the disclosure, the disclosure is not limited to these exemplary illustrated units. Aspects of the disclosure may be suitably employed in many devices which include the disclosed offset canceling dual stage sensing apparatus.

Figure 11:
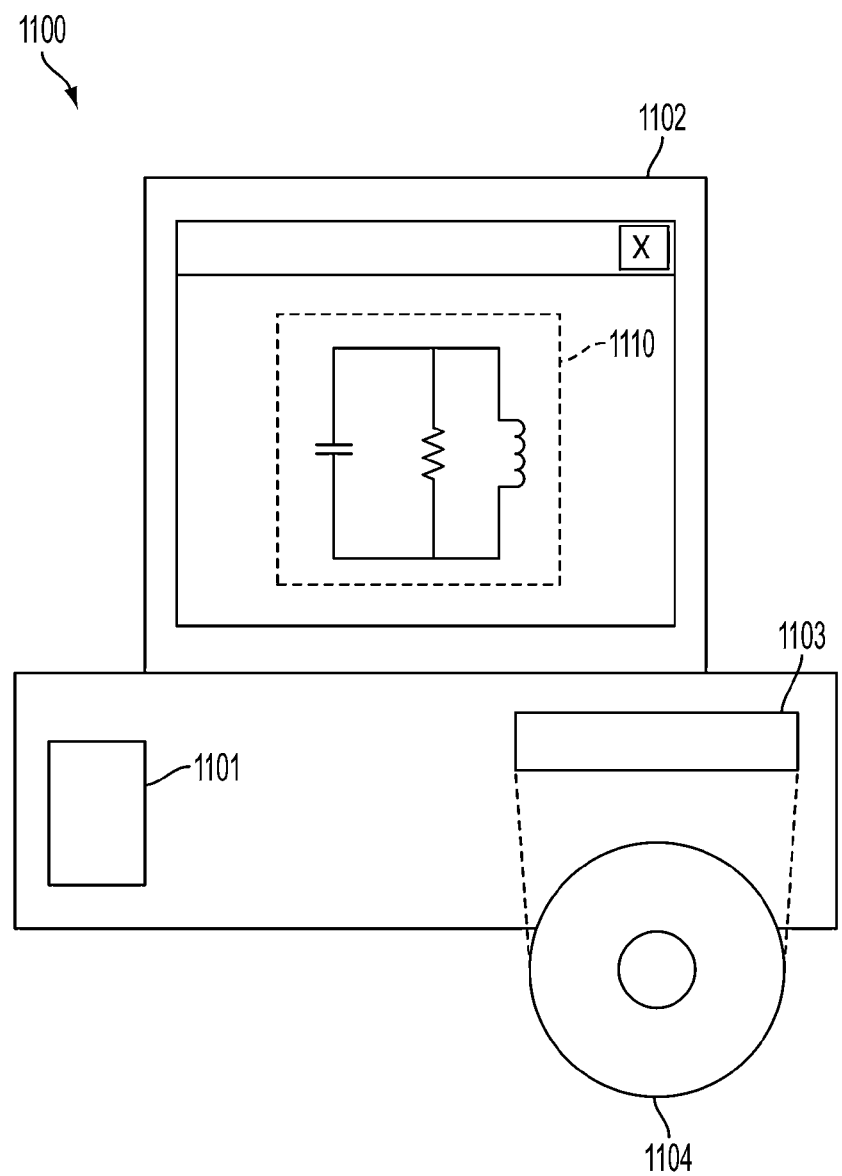
FIG. 11 is a block diagram illustrating a design workstation used for circuit, layout, and logic design of a semiconductor component according to one configuration.

FIG. 11 is a block diagram illustrating a design workstation used for circuit, layout, and logic design of a semiconductor component, such as the offset canceling dual stage sensing apparatus disclosed above. A design workstation 1100 includes a hard disk 1101 containing operating system software, support files, and design software such as Cadence or OrCAD. The design workstation 1100 also includes a display 1102 to facilitate design of a circuit design 1110 or a semiconductor component 1112 such as an offset canceling dual stage sensing apparatus. A storage medium 1104 is provided for tangibly storing the circuit design 1110 or the semiconductor component 1112. The circuit design 1110 or the semiconductor component 1112 may be stored on the storage medium 1104 in a file format such as GDSII or GERBER. The storage medium 1104 may be a CD-ROM, DVD, hard disk, flash memory, or other appropriate device. Furthermore, the design workstation 1100 includes a drive apparatus 1103 for accepting input from or writing output to the storage medium 1104.

Data recorded on the storage medium 1104 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1104 facilitates the design of the circuit design 1110 or the semiconductor component 1112 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, although SRAM and MRAM were described as types of memories, other memory types are also contemplated, such as DRAM, PCRAM, etc. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A sensing method, comprising:
    in a first stage operation of a resistive memory sensing circuit, sensing a data value of a resistive memory data cell using a first load PMOS gate voltage generated by a reference value of a resistive memory reference cell; and
    in a second stage operation of the resistive memory sensing circuit, sensing the reference value of the resistive memory reference cell using a second load PMOS gate voltage generated by the data value of the resistive memory data cell.

2. The method of claim 1, further comprising switching between the first stage operation and the second stage operation by switching circuitry between the resistive memory reference cell and the resistive memory data cell.

3. The method of claim 1, further comprising generating the data value and the reference value at an identical node.

4. The method of claim 1, further comprising integrating the resistive memory sensing circuit into a mobile phone, a set top box, a music player, a video player, an entertainment unit, a navigation device, a computer, a hand-held personal communication systems (PCS) unit, a portable data unit, and/or a fixed location data unit.

5. A sensing apparatus, comprising:
    a sense amplifier circuit including a first switch coupled between a first output node and a first input node, and a second switch coupled between a second output node and a second input node, the first switch and the second switch being controlled by a sense amplifier enable signal to isolate a reference value of a resistive memory reference cell from a data value of a resistive memory data cell.

6. The sensing apparatus of claim 5, in which the first switch and the second switch are CMOS pass gates.

7. The sensing apparatus of claim 5, integrated in a mobile phone, a set top box, a music player, a video player, an entertainment unit, a navigation device, a computer, a hand-held personal communication systems (PCS) unit, a portable data unit, and/or a fixed location data unit.

8. A sensing method, comprising:
    in a first stage operation of a resistive memory sensing circuit, applying a first load transistor gate voltage to a first load transistor based on a reference value (Rref) of a resistive memory reference cell;
    in the first stage operation, applying a first sense current through the first load transistor to a resistive memory data cell based on the first load transistor gate voltage;
    in the first stage operation, sensing a data value of the resistive memory data cell based on the first sense current;
    in a second stage operation of the resistive memory sensing circuit after the first stage operation, applying a second load transistor gate voltage to a second load transistor based on a data value (Rdata) of the resistive memory data cell;
    in the second stage operation, applying a second sense current through the second load transistor to the resistive memory reference cell; and
    in the second stage operation, sensing a reference value of the resistive memory reference cell based on the second sense current.

9. The sensing method of claim 8, further comprising switching between the first stage operation and the second stage operation by switching circuitry between the resistive memory reference cell and the resistive memory data cell.

10. The sensing method of claim 8, further comprising generating the data value and the reference value at an identical node.

11. The sensing method of claim 8 further comprising integrating the resistive memory sensing circuit into a mobile phone, a set top box, a music player, a video player, an entertainment unit, a navigation device, a computer, a hand-held personal communication systems (PCS) unit, a portable data unit, and/or a fixed location data unit.

12. A resistive memory sensing apparatus, comprising:
    means for sensing a data value of a resistive memory data cell during a first stage operation of the resistive memory sensing apparatus using a first load PMOS gate voltage generated by a reference value of a resistive memory reference cell; and
    means for sensing the reference value of the resistive memory reference cell during a second stage operation of the resistive memory sensing apparatus using a second load PMOS gate voltage generated by the data value of the resistive memory data cell.

13. The resistive memory sensing apparatus of claim 12, integrated in a mobile phone, a set top box, a music player, a video player, an entertainment unit, a navigation device, a computer, a hand-held personal communication systems (PCS) unit, a portable data unit, and/or a fixed location data unit.

14. A resistive memory sensing circuit, comprising:
    means for applying a first load transistor gate voltage to a first load transistor during a first stage operation of the resistive memory sensing circuit based on a reference value (Rref) of a resistive memory reference cell;
    means for applying a first sense current through the first load transistor to a resistive memory data cell during the first stage operation based on the first load transistor gate voltage;
    means for sensing a data value of the resistive memory data cell during the first stage operation based on the first sense current;
    means for applying a second load transistor gate voltage to a second load transistor during a second stage operation of the resistive memory sensing circuit after the first stage operation based on a data value (Rdata) of the resistive memory data cell;
    means for applying a second sense current through the second load transistor to the resistive memory reference cell during the second stage operation; and
    means for sensing a reference value of the resistive memory reference cell during the second stage operation based on the second sense current.

15. The resistive memory sensing circuit of claim 14, integrated in a mobile phone, a set top box, a music player, a video player, an entertainment unit, a navigation device, a computer, a hand-held personal communication systems (PCS) unit, a portable data unit, and/or a fixed location data unit.

16. A sensing method, comprising steps of:
    in a first stage operation of a resistive memory sensing circuit, sensing a data value of a resistive memory data cell using a first load PMOS gate voltage generated by a reference value of a resistive memory reference cell; and
    in a second stage operation of the resistive memory sensing circuit, sensing the reference value of the resistive memory reference cell using a second load PMOS gate voltage generated by the data value of the resistive memory data cell.

17. The method of claim 16, further comprising the step of switching between the first stage operation and the second stage operation by switching circuitry between the resistive memory reference cell and the resistive memory data cell.

18. The method of claim 16, further comprising the step of integrating the resistive memory sensing circuit into a mobile phone, a set top box, a music player, a video player, an entertainment unit, a navigation device, a computer, a hand-held personal communication systems (PCS) unit, a portable data unit, and/or a fixed location data unit.

19. A sensing method, comprising steps of:
    in a first stage operation of a resistive memory sensing circuit, applying a first load transistor gate voltage to a first load transistor based on a reference value (Rref) of a resistive memory reference cell;
    in the first stage operation, applying a first sense current through the first load transistor to a resistive memory data cell based on the first load transistor gate voltage;
    in the first stage operation, sensing a data value of the resistive memory data cell based on the first sense current;
    in a second stage operation of the resistive memory sensing circuit after the first stage operation, applying a second load transistor gate voltage to a second load transistor based on a data value (Rdata) of the resistive memory data cell;
    in the second stage operation, applying a second sense current through the second load transistor to the resistive memory reference cell; and
    in the second stage operation, sensing a reference value of the resistive memory reference cell based on the second sense current.

20. The sensing method of claim 19 further comprising the step of integrating the resistive memory sensing circuit into a mobile phone, a set top box, a music player, a video player, an entertainment unit, a navigation device, a computer, a hand-held personal communication systems (PCS) unit, a portable data unit, and/or a fixed location data unit.

* * * * *